United States Patent
Hsu

(10) Patent No.: US 11,073,862 B2
(45) Date of Patent: Jul. 27, 2021

(54) SYNCHRONIZATION CIRCUIT AND CASCADED SYNCHRONIZATION CIRCUIT FOR CONVERTING ASYNCHRONOUS SIGNAL INTO SYNCHRONOUS SIGNAL

(71) Applicant: Elite Semiconductor Memory Technology Inc., Hsinchu (TW)

(72) Inventor: Jen-Shou Hsu, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 99 days.

(21) Appl. No.: 16/565,505

(22) Filed: Sep. 10, 2019

(65) Prior Publication Data

US 2021/0072785 A1    Mar. 11, 2021

(51) Int. Cl.
  *G06F 1/12*    (2006.01)
  *G06F 13/42*   (2006.01)
  *H04L 5/00*    (2006.01)

(52) U.S. Cl.
  CPC ..................... *G06F 1/12* (2013.01)

(58) Field of Classification Search
  CPC ........................................ G06F 1/12
  See application file for complete search history.

(56) References Cited

U.S. PATENT DOCUMENTS

| 7,082,484 B2 * | 7/2006 | Cranford, Jr. ......... G06F 13/423 710/106 |
| 7,484,166 B2 * | 1/2009 | Yoshida ........... G01R 31/31704 714/700 |
| 7,952,401 B2 | 5/2011 | Ramakrishnan |
| 2003/0184347 A1 * | 10/2003 | Haroun ............... H03K 3/0322 327/99 |
| 2009/0323457 A1 | 12/2009 | Shori |
| 2015/0341032 A1 | 11/2015 | Sadowski |
| 2016/0292331 A1 * | 10/2016 | Gupta ................. G06F 30/3312 |

FOREIGN PATENT DOCUMENTS

| JP | 11-168374 | 6/1999 |
| TW | 200301042 | 6/2003 |
| TW | 200710658 | 3/2007 |
| TW | 200937864 | 9/2009 |

* cited by examiner

*Primary Examiner* — Mohammed H Rehman
(74) *Attorney, Agent, or Firm* — Winston Hsu

(57) ABSTRACT

A synchronization circuit and a cascaded synchronization circuit for converting an asynchronous signal into at least one synchronous signal are provided. The synchronization circuit includes a signal control circuit, a flip-flop circuit, a clock enable circuit and a clock control circuit. The flip-flop circuit is coupled to the signal control circuit, the clock enable circuit is coupled to the signal control circuit and the flip-flop circuit, and the clock enable circuit is coupled to the signal control circuit and the flip-flop circuit. The signal control circuit and the clock control circuit can guarantee hold time and setup time is sufficient to allow the flip-flop circuit to output the synchronous signal without glitch regardless of the asynchronous signal.

15 Claims, 6 Drawing Sheets

SYNCHRONIZATION CIRCUIT AND CASCADED SYNCHRONIZATION CIRCUIT FOR CONVERTING ASYNCHRONOUS SIGNAL INTO SYNCHRONOUS SIGNAL

BACKGROUND OF THE INVENTION

1. Field of the Invention

The present invention is related to electronic circuits, and more particularly, to a synchronization circuit and a cascaded synchronization circuit for converting an asynchronous signal into a synchronous signal.

2. Description of the Prior Art

In some integrated circuit designs (e.g. a controller circuit for controlling operations of a memory device), asynchronous control signals may need to be converted into synchronous signals before being transmitted to corresponding function blocks. Based on a reference clock signal, a synchronization circuit can convert an asynchronous signal into an output signal that is synchronous with the reference clock signal. In practice, the output signal of the synchronization circuit might have glitch in some situations, however. For example, when an edge (e.g. a rising edge or a falling edge) of the asynchronous signal is extremely close to a trigger edge of the reference clock signal, or when the asynchronous signal has a narrow pulse at the time point of the trigger edge of the reference clock signal, the output signal of the synchronization circuit may be affect by uncertainty of states of the asynchronous signal, thereby introducing glitches.

SUMMARY OF THE INVENTION

Thus, an objective of the present invention is to provide a synchronization circuit and a cascaded synchronization circuit for converting an asynchronous signal into a synchronous signal, in order to guarantee that a synchronous signal can be properly generated without any glitch.

At least one embodiment of the present invention provides a synchronization circuit for converting an asynchronous signal into at least one synchronous signal, wherein the synchronization circuit may comprise a signal control circuit, a flip-flop circuit, a clock enable circuit and a clock control circuit. The signal control circuit is configured to latch a logic value of an internal input signal and output the internal input signal when a difference between the asynchronous signal and the synchronous signal is detected. The flip-flop circuit is coupled to the signal control circuit, and is configured to output the synchronous signal according to the internal input signal at a time point of a transition edge of a flip-flop clock signal. The clock enable circuit is coupled to the signal control circuit and the flip-flop circuit, and is configured to enable an internal clock signal when a difference between the synchronous signal and the internal input signal is detected. The clock control circuit is coupled to the flip-flop circuit and the clock enable circuit, and is configured to output the flip-flop clock signal in response to a pulse width of the internal clock signal.

At least one embodiment of the present invention provides a cascaded synchronization circuit for converting an initial asynchronous signal into a final synchronous signal. The cascaded synchronization circuit may comprise a first synchronization circuit and a second synchronization circuit connected in series, and each synchronization circuit of the first synchronization circuit and the second synchronization circuit is configured to convert an asynchronous signal into at least one synchronous signal based on a main clock signal. More particularly, the first synchronization circuit converts the initial asynchronous signal into a temporary synchronous signal based on the main clock signal, and the second synchronization circuit converts the temporary synchronous signal into the final synchronous signal based on the main clock signal. Each synchronization circuit may comprise a signal control circuit, a flip-flop circuit, a clock enable circuit and a clock control circuit. The signal control circuit is configured to latch a logic value of an internal input signal and output the internal input signal when a difference between the asynchronous signal and the synchronous signal is detected. The flip-flop circuit is coupled to the signal control circuit, and is configured to output the synchronous signal according to the internal input signal at a time point of a transition edge of a flip-flop clock signal. The clock enable circuit is coupled to the signal control circuit and the flip-flop circuit, and is configured to enable an internal clock signal when a difference between the synchronous signal and the internal input signal is detected. The clock control circuit is coupled to the flip-flop circuit and the clock enable circuit, and is configured to output the flip-flop clock signal in response to a pulse width of the internal clock signal. According to the cascaded synchronization circuit, a phase relationship between the main clock signal and the final synchronous signal is fixed regardless of the initial asynchronous signal.

The synchronization circuit of the present invention provides a robust operating mechanism, which can guarantee that the synchronous signal generated by the synchronization circuit has no glitch regardless of the asynchronous signal. In addition, a cascaded architecture based on a synchronization circuit of the present invention is further provided in order to guarantee a phase relationship between the synchronous signal and target timing is fixed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
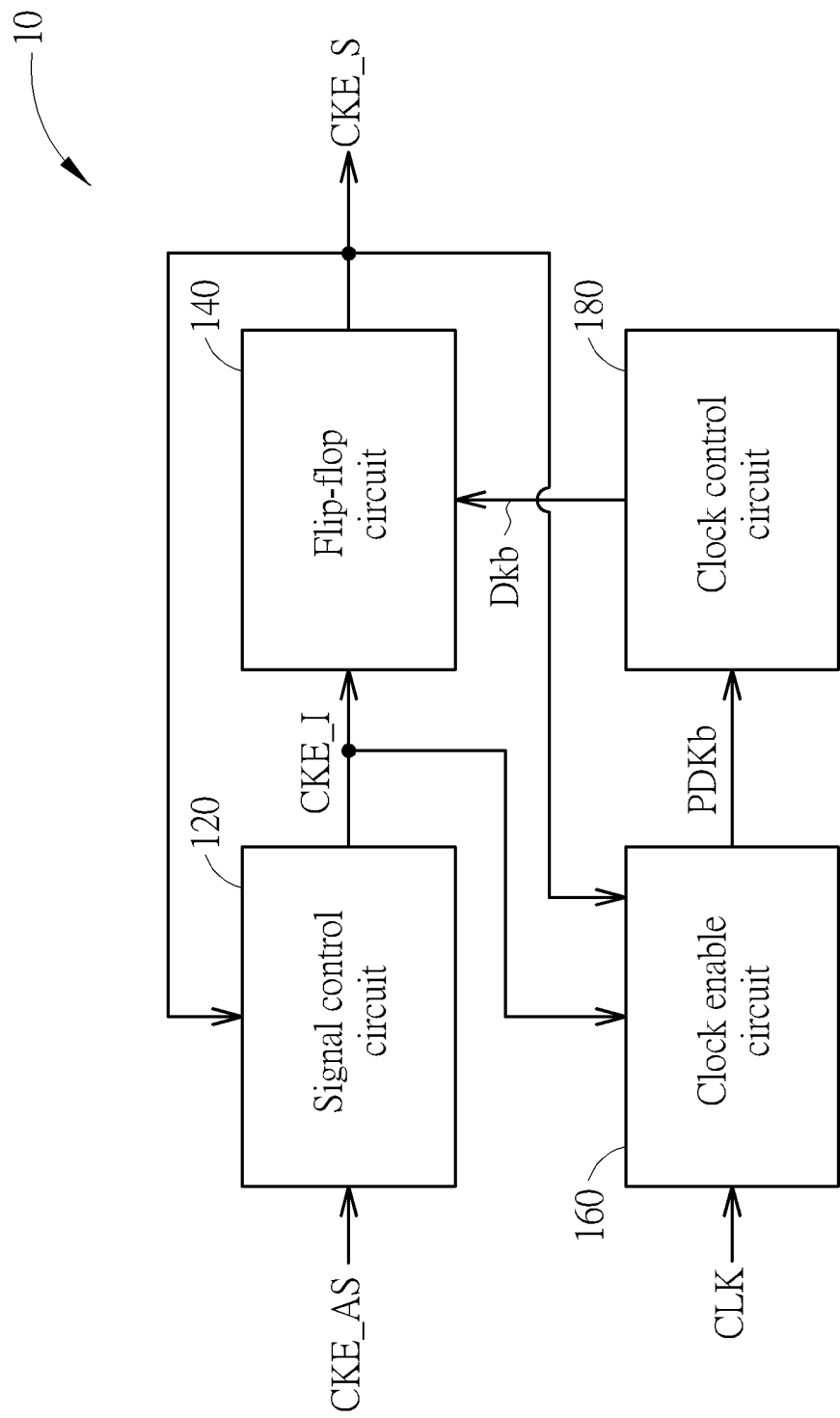
FIG. 1 is a block diagram illustrating a synchronization circuit according to an embodiment of the present invention.

FIG. 1 is a block diagram illustrating a synchronization circuit 10 according to an embodiment of the present invention, where the synchronization circuit 10 is configured for converting an asynchronous signal (such as a signal CKE_AS) into at least one synchronous signal (e.g. one or more synchronous signals, which are collectively referred to as the synchronous signal). The synchronization circuit 10 may comprise a signal control circuit 120, a flip-flop circuit 140, a clock enable circuit 160 and a clock control circuit 180. The flip-flop circuit 140 is coupled to the signal control circuit 120, the clock enable circuit 160 is coupled to the signal control circuit 120 and the flip-flop circuit 140, and the clock control circuit 180 is coupled to the flip-flop circuit 140 and the clock enable circuit 160.

In operations of the signal control circuit 120, the signal control circuit 120 may latch a logic value of an internal input signal (such as a signal CKE_I) and output the internal input signal when a difference between the asynchronous signal (e.g. the signal CKE_AS) and the synchronous signal (e.g. any of the one or more synchronous signals such as a signal CKE_S) is detected. More particularly, when the signal CKE_S has a first logic value, the signal control circuit 120 may latch the logic value of the signal CKE_I and output the signal CKE_I having the logic value in response to the signal CKE_AS changing from the first logic value to a second logic value, where the logic value of the signal CKE_I is equivalent to the second logic value. For example, when a logic value of the signal CKE_S is "0" and a logic value of the signal CKE_AS changes from "0" to "1", the signal control circuit 120 may latch the logic value of the signal CKE_I at "1" and output the signal CKE_I. In another example, when the logic value of the signal CKE_S is "1" and the logic value of the signal CKE_AS changes from "1" to "0", the signal control circuit 120 may latch the logic value of the signal CKE_I at "0" and output the signal CKE_I.

In operations of the clock enable circuit 160, the clock enable circuit 160 may enable an internal clock signal (such as a signal PDKb) when a difference between the signals CKE_S and CKE_I is detected. For example, the internal clock signal may be disabled if no difference between the signals CKE_S and CKE_I is detected, thereby saving overall power consumption of the synchronization circuit 10. More particularly, when the signal CKE_S and the signal CKE_I have different logic values, the clock enable circuit 160 may output the signal PDKb according to a main clock signal such as a signal CLK; and when the signal CKE_S and the signal CKE_I have a same logic value, the signal PDKb may have a fix logic value. For example, when the logic values of the signal CKE_S and the signal CKE_I are "0" and "1", respectively (or "1" and "0", respectively), the clock enable circuit 160 may output the signal PDKb according to the signal CLK, i.e. enable the signal PDKb toggling. In another example, when both of the logic values of the signal CKE_S and the signal CKE_I are "0" (or "1"), the clock enable circuit 160 may fix the logic value of the signal PDKb at "1", i.e. disable the signal PDKb toggling.

In operations of the clock control circuit 180, the clock control circuit 180 may output a flip-flop clock signal (such as a signal DKb) in response to a pulse width of the signal PDKb. More particularly, when the pulse width of the signal PDKb is greater than a predetermined width, the signal DKb may have a pulse width greater than a minimum width; and when the pulse width of the signal PDKb is less than the predetermined width, the signal DKb may have a fix logic value. For example, when the pulse width of the signal PDKb is greater than the predetermined width, the clock control circuit 180 may control the signal DKb to guarantee the pulse width of the signal DKb to be greater than the minimum width. In another example, when the time point of the logic values of the signals CKE_I and CKE_S becoming different is close to an edge (e.g. a falling edge) of the signal CLK, the pulse width of the signal PDKb might be therefore less than the predetermined width, and the clock control circuit 180 may fix the signal DKb at "1", i.e. disable the signal DKb toggling.

In operations of the flip-flop circuit 140, the flip-flop circuit 140 may output the synchronous signal (e.g. the signal CKE_S) according to the signal CKE_I at a time point of a transition edge of the signal DKb. Based on control of the signals CKE_I and DKb mentioned above, sufficient setup time and hold time can be provided, so the flip-flop circuit 140 can stably output the CKE_S without glitch regardless of the signal CKE_AS.

Figure 2:
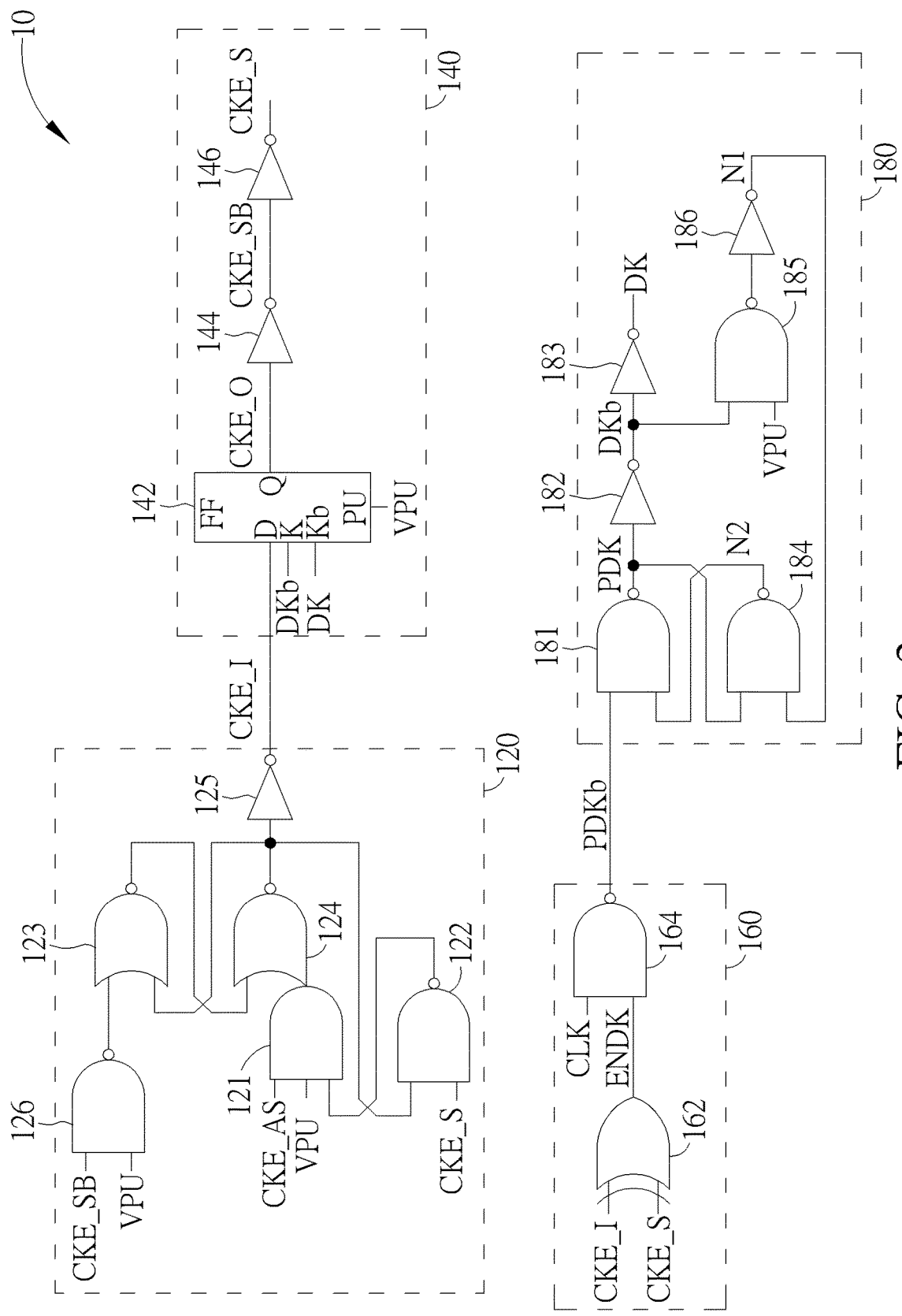
FIG. 2 is a circuit diagram illustrating the synchronization circuit shown in FIG. 1 according to an embodiment of the present invention.

FIG. 2 is a circuit diagram illustrating the synchronization circuit 10 according to an embodiment of the present invention. It should be noted that terminals labeled the same symbol may be regarded as being directly connected to each other, and connecting lines between these terminals are omitted for brevity.

As shown in FIG. 2, the flip-flop circuit 140 may comprise a flip-flop logic circuit 142 (labeled as "FF" for brevity) and one or more inverters such as inverters 144 and 146. In this embodiment, the flip-flop logic circuit 142 may comprise a plurality of input terminals (such as terminals D, K, Kb and PU) and an output terminal (such as terminal Q), where the terminals D, K, Kb and PU are respectively configured to receive signals CKE_I, DKb, DK and VPU, and the terminal Q is configured to transmit a signal CKE_O to the inverter 144, where the signal DK is an inverted signal of the signal DKb. The signal VPU is configured to provide some nodes within the synchronization circuit 10 with initial values, and a logic value of the signal VPU may change to "1" from "0" when the synchronization circuit 10 is powered on (or enabled). It should be noted that when the logic value of the signal VPU is "0", the flip-flop logic circuit 142 may fix the signal CKE_O at "0" (or "1") regardless of the signals CKE_I, DKb and DK; and when the logic value of the signal VPU is "1", the flip-flop circuit 142 may output and update the signal CKE_O according to the signal CKE_I at rising edges of the signal DKb; but the present invention is not limited thereto. In addition, the inverter 144 may generate an inverted signal of the signal CKE_O (such as a signal CKE SB) and transmit the signal CKE SB to the inverter 146; and the inverter 146 may generate an inverted signal of the signal CKE SB such as the signal CKE_S.

As shown in FIG. 2, the signal control circuit 120 may comprise an AND logic circuit 121, a NAND logic circuit 122, a NOR logic circuit 123, a NOR logic circuit 124 and an inverter 125, where the signal control circuit 120 may further comprise a NAND logic circuit 126 for power up control. A first input terminal and a second input terminal of the AND logic circuit 121 are respectively configured to receive the signals CKE_AS and VPU. An output terminal of the NAND logic circuit 122 is coupled to a third input terminal of the AND logic circuit 121, and a first input terminal of the NAND logic circuit 122 is configured to receive the signal CKE_S. A first input terminal of the NOR logic circuit 123 is coupled to an output terminal of the NAND logic circuit 126, where a first input terminal and a second input terminal of the NAND logic circuit 126 are respectively configured to receive the signals CKE SB and VPU. For example, when the logic value of the signal VPU is "0", the NAND logic circuit 126 may transmit the logic value "1" regardless of the signal CKE SB to the NOR logic circuit 123. When the logic value of the signal VPU is "1", the NAND logic circuit 126 may serve as an inverter to transmit an inverted signal of the signal CKE SB to the NOR logic circuit 123. Thus, the first input terminal of the NOR logic circuit 123 is configured to receive the synchronous signal (e.g. any of the signals CKE_O and CKE_S) or a derivative thereof (e.g. the signal transmitted from the NAND logic circuit 126) after the synchronization circuit 10 is powered on (or be enabled). An output terminal of the NOR logic circuit 124 is coupled to a second input terminal of the NOR logic circuit 123 and a second input terminal of the NAND logic circuit 122, a first input terminal of the NOR logic circuit 124 is coupled to an output terminal of the NOR logic circuit 123, and a second input terminal of the NOR logic circuit 124 is coupled to an output terminal of the AND logic circuit 121. An input terminal of the inverter 125 is coupled to the output terminal of the NOR logic circuit 124, to allow the inverter 125 to output the signal CKE_I. Based on this architecture, the signal control circuit 120 can detect a change (e.g. state transition) of the signal CKE_AS relative to the signal CKE_S, and latch the changed logic value of the signal CKE_AS to provide sufficient setup time and hold time for the flip-flop circuit 140.

As shown in FIG. 2, the clock enable circuit 160 may comprise an exclusive-OR (XOR) logic circuit 162 and a NAND logic circuit 164. A first input terminal and a second input terminal of the XOR logic circuit 162 are configured to receive the internal input signal and the synchronous signal respectively, to generate a signal ENDK which may indicate whether logic values of the signals CKE_I and CKE_S are different. It should be noted that the synchronous signal transmitted to the XOR logic circuit 162 for detection may be the signal CKE_O in some embodiments, but the present invention is not limited thereto. The NAND logic circuit 164 is configured to output the signal PDKb, where a first input terminal of the NAND logic circuit 164 is configured to receive the signal CLK, and a second input terminal of the NAND logic circuit 164 is coupled to an output terminal of the XOR logic circuit 162 for receiving the signal ENDK.

As shown in FIG. 2, the clock control circuit 180 may comprise NAND logic circuits 181, 184 and 185, and inverters 182, 183 and 186. A first input terminal of the NAND logic circuit 181 is configured to receive the signal PDKb, where an input terminal of the inverter 182 is coupled to an output terminal of the NAND logic circuit 181 to output the signal DKb, and an input terminal of the inverter 183 is coupled to an output terminal of the inverter 182 to output the signal DK. A first input terminal and a second input terminal of the NAND logic circuit 185 are respectively configured to receive the signals DKb and VPU, and an output terminal of the NAND logic circuit 185 is coupled to an input terminal of the inverter 186. A first input terminal of the NAND logic circuit 184 is coupled to the output terminal of the NAND logic circuit 181, and an output terminal of the NAND logic circuit 184 is coupled to a second input terminal of the NAND logic circuit 181. It should be noted that when the logic state of the signal VPU is "1", a signal N1 outputted from the inverter 186 may be equivalent to the signal DKb. Thus, a second input terminal of the NAND logic circuit 184 is configured to receive the flip-flop clock signal (e.g. the signal DKb) or a derivative thereof (e.g. the signal N1) after the synchronization circuit 10 is powered on.

Regarding the clock control circuit 180, the aforementioned predetermined width and minimum width can be determined by transistor sizes of the aforementioned logic circuits (such as one or more of the inverters 182 and 186, and the NAND logic circuits 185, 181 and 184). In this embodiment, a ratio parameter of the inverter 182 is less than that of the NAND logic circuit 184, where for any of the aforementioned logic circuits, the ratio parameter represents a ratio between a width-to-length ratio of an N-type transistor (which may be referred to as "$(W/L)_N$") and that of a P-type transistor (which may be referred to as "$(W/L)_P$"). Based on this architecture, a pull down strength of the inverter 182 is less than that of the NAND logic circuit 184. Thus, when a falling edge of the signal PDKb is transmitted to the NAND logic circuit 181 and thereby pull up the signal PDK, a signal N2 outputted by the NAND logic circuit 184 may be pulled down earlier than the signal DKb outputted by the inverter 182. It should be noted that if a low pulse width of the signal PDKb is not wide enough to pull down the signal N2 before the signal PDK is pulled down again, the signal will not be pulled down at all, and it means the transition of the signal PDKb is omitted in this operation; and if the low pulse width of the signal PDKb is wide enough to pull down the signal N2, the signal PDK may be pulled down until the signal N2 is pulled up again (which need to be trigger by the signal N1), thereby making the pulse width of the signal DKb greater than the aforementioned minimum width, i.e. if the signal PDK is a high pulse which is wide enough to pull down the signal N2, the signal DKb will have a minimum low pulse width at least 5 gates (185-186-184-181-182) delayed time), and if the signal PDK is a high pulse which is not wide enough to pull down the signal N2, the signal DKb will not have a low pulse generation.

Figure 3:
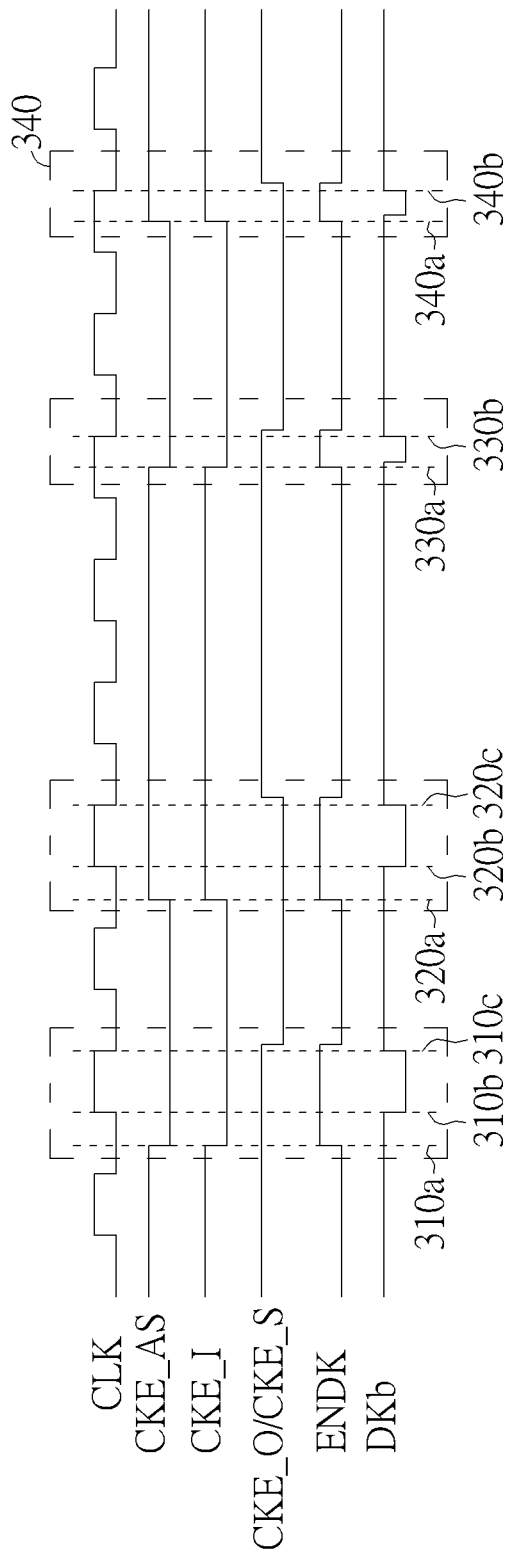
FIG. 3 is a timing diagram illustrating a plurality of signals within the synchronization circuit shown in FIG. 2 in an embodiment of the present invention.

FIG. 3 is a timing diagram illustrating a plurality of signals within the synchronization circuit 10 in an embodiment of the present invention. This embodiment illustrates four conditions such as conditions 310, 320, 330 and 340. In the condition 310, the signal CKE_AS turns to low (i.e. the logic state thereof changes to "0" from "1") when the signal CLK is low (i.e. having a logic value "0"); in the condition 320, the signal CKE_AS turns to high (i.e. the logic state thereof changes to "1" from "0") when the signal CLK is low; in the condition 330, the signal CKE_AS turns to low when the signal CLK is high (i.e. having a logic value "1"); in the condition 340, the signal CKE_AS turns to high when the signal CLK is high.

Please refer to the condition 310 shown in FIG. 3 and the synchronization circuit 10 shown in FIG. 2. After the signal CKE_AS turns to low at a time point 310a (note that the signal CKE_S is high at this moment), the signal CKE_I turns to low, and the signal ENDK turns to high. After the signal CLK turns to high at a time point 310b, the signal DKb turns to low. After the signal CLK turns to low at a time point 310c, the signal DKb turns to high, the signals CKE_O and CKE_S turn to low, and the signal ENDK turns to low.

Please refer to the condition 320 shown in FIG. 3 and the synchronization circuit 10 shown in FIG. 2. After the signal CKE_AS turns to high at a time point 320a (note that the signal CKE_S is low at this moment), the signal CKE_I turns to high, and the signal ENDK turns to high. After the signal CLK turns to high at a time point 320b, the signal DKb turns to low. After the signal CLK turns to low at a time point 320c, the signal DKb turns to high, the signals CKE_O and CKE_S turn to high, and the signal ENDK turns to low.

Please refer to the condition 330 shown in FIG. 3 and the synchronization circuit 10 shown in FIG. 2. After the signal CKE_AS turns to low at a time point 330a (note that the signal CKE_S is high at this moment), the signal CKE_I turns to low, the signal ENDK turns to high, and the signal DKb turns to low. After the signal CLK turns to low at a time point 330b, the signal DKb turns to high, the signals CKE_O and CKE_S turn to low, and the signal ENDK turns to low.

Please refer to the condition 340 shown in FIG. 3 and the synchronization circuit 10 shown in FIG. 2. After the signal CKE_AS turns to high at a time point 340a (note that the signal CKE_S is low at this moment), the signal CKE_I turns to high, the signal ENDK turns to high, and the signal DKb turns to low. After the signal CLK turns to low at a time point 340b, the signal DKb turns to high, the signals CKE_O and CKE_S turn to high, and the signal ENDK turns to low.

Figure 4:
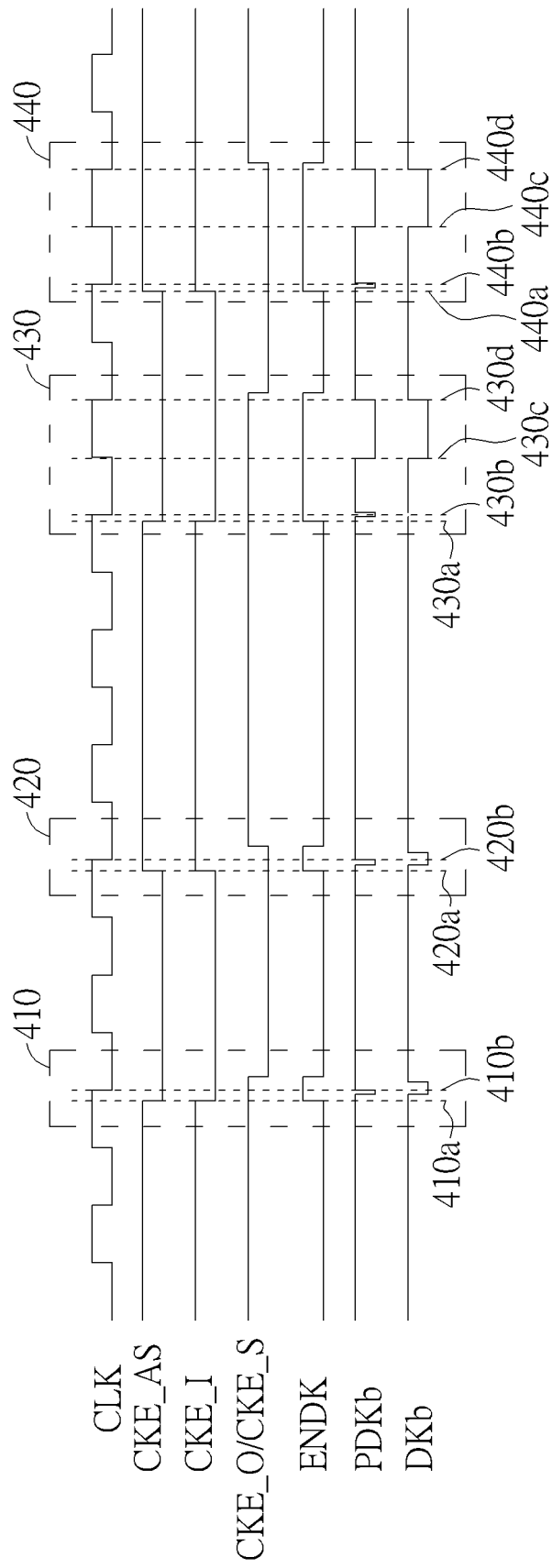
FIG. 4 is a timing diagram illustrating a plurality of signals within the synchronization circuit shown in FIG. 2 in another embodiment of the present invention.

FIG. 4 is a timing diagram illustrating a plurality of signals within the synchronization circuit 10 in another embodiment of the present invention. This embodiment illustrates four conditions such as conditions 410, 420, 430 and 440. In the conditions 410 and 430, the signal CKE_AS turns to low when the signal CLK is high; and in the conditions 420 and 440, the signal CKE_AS turns to high when the signal CLK is high; where it should be noted that transition edges of the CKE_AS in all of these conditions are close to falling edges of the signal CLK, respectively, as shown in FIG. 4.

Please refer to the condition 410 shown in FIG. 4 and the synchronization circuit 10 shown in FIG. 2. After the signal CKE_AS turns to low at a time point 410a (note that the signal CKE_S is high and the signal CLK is high at this moment), the signal CKE_I turns to low, the signal ENDK turns to high, and the signals PDKb and DKb turn to low. After the signal CLK turns to low at a time point 410b, the signal PDKb returns to high, where a high pulse (i.e. a pulse of logic value "1") of the signal PDK is wide enough to pull down the signal N2 and can be further widened in comparison with a low pulse (i.e. a pulse of logic value "0") of the signal PDKb. More particularly, after the signal N2 turns to low in response to the signal PDK turns to high, the signal PDK may not immediately turn to low in response to the signal PDKb turning to high until the signal N2 is pulled up again via the signal path of the inverter 182, the NAND 185, the inverter 186, the NAND 184 and the NAND 181, thereby widening the high pulse of the signal PDK (or the low pulse of the signal DKb). Afterwards, the signals CKE_O and CKE_S turn to low, and the signal ENDK turns to low.

Please refer to the condition 420 shown in FIG. 4 and the synchronization circuit 10 shown in FIG. 2. After the signal CKE_AS turns to high at a time point 420a (note that the signal CKE_S is low and the signal CLK is high at this moment), the signal CKE_I turns to high, the signal ENDK turns to high, and the signals PDKb and DKb turn to low. After the signal CLK turns to low at a time point 420b, the signal PDKb returns to high, where a high pulse of the signal PDK can be widened in comparison with a low pulse of the signal PDKb, and some detailed descriptions similar to the condition 410 are not repeated here for brevity. Afterwards, the signals CKE_O and CKE_S turn to high, and the signal ENDK turns to low.

Please refer to the condition 430 shown in FIG. 4 and the synchronization circuit 10 shown in FIG. 2. After the signal CKE_AS turns to low at a time point 430a (note that the signal CKE_S is high and the signal CLK is high at this moment), the signal CKE_I turns to low, the signal ENDK turns to high, and the signal PDKb turns to low. After the signal CLK turns to low at a time point 430b, the signal PDKb turns to high, but a high pulse of the signal PDK is too narrow to pull down the signal N2 (and the signal DKb), so the signal DKb is kept at the original logic state thereof and the flip-flop circuit 142 will not be triggered. After the signal CLK turns to high at a time point 430c, the signal DKb turns to low. After the signal CLK turns to low at a time point 430d, the signal DKb turns to high, the signals CKE_O and CKE_S turn to low, and the signal ENDK turns to low.

Please refer to the condition 440 shown in FIG. 4 and the synchronization circuit 10 shown in FIG. 2. After the signal CKE_AS turns to high at a time point 440a (note that the signal CKE_S is low and the signal CLK is high at this moment), the signal CKE_I turns to high, the signal ENDK turns to high, and the signal PDKb turns to low. After the signal CLK turns to low at a time point 440b, the signal PDKb turns to high, but a high pulse of the signal PDK is too narrow to pull down the signal N2 (and the signal DKb), so the signal DKb is kept at the original logic state thereof and the flip-flop circuit 142 will not be triggered. After the signal CLK turns to high at a time point 440c, the signal DKb turns to low. After the signal CLK turns to low at a time point 440d, the signal DKb turns to high, the signals CKE_O and CKE_S turn to high, and the signal ENDK turns to low.

Figure 5:
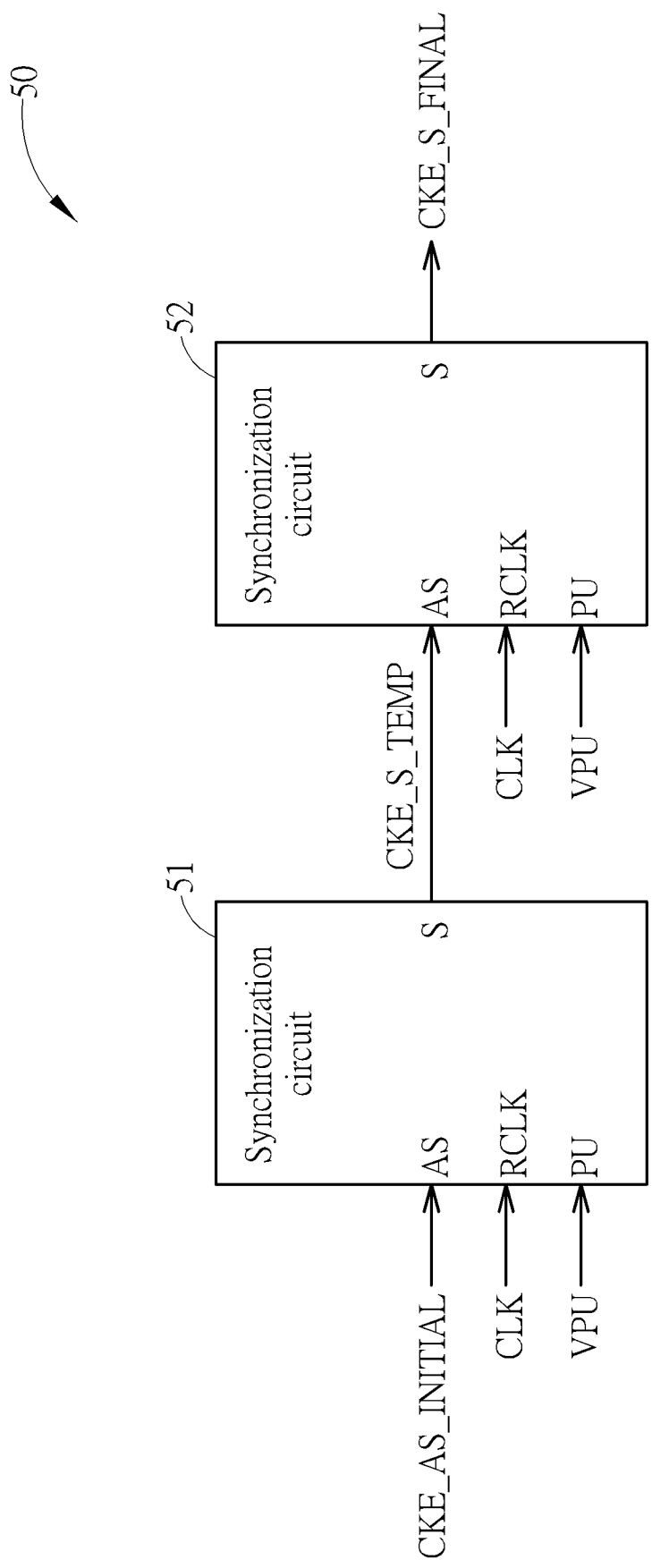
FIG. 5 is a diagram illustrating a cascaded synchronization circuit according to an embodiment of the present invention.

As shown in FIG. 4, the mechanism of widening the high pulse of the signal PDK (and the low pulse of the signal DKb) may introduce additional delay between falling edges of the signal CLK (the target timing for the synchronous signals) and transition edges of the synchronous signal (such as the signals CKE_O and CKE_S). In some embodiment, two identical synchronization circuits can be connected in series in order to avoid the aforementioned delay as shown in FIG. 5, where FIG. 5 is a diagram illustrating a cascaded synchronization circuit 50 according to an embodiment of the present invention. As shown in FIG. 5, the cascaded synchronization circuit 50 may convert an initial asynchronous signal (e.g. a signal CKE_AS_INITIAL) into a final synchronous signal (e.g. a signal CKE_S_FINAL). The cascaded synchronization circuit 50 may comprise a first synchronization circuit (e.g. a synchronization circuit 51) and a second synchronization circuit (e.g. a synchronization circuit 52) connected in series. Each of the synchronization circuit 51 and 52 may convert an asynchronous signal into at least one synchronous signal based on a main clock signal (e.g. the signal CLK). In this embodiment, the synchronization circuit 51 may convert the initial asynchronous signal (e.g. the signal CKE_AS_INITIAL) into a temporary synchronous signal (e.g. a signal CKE_S_TEMP) based on the signal CLK, and the synchronization circuit 52 may convert the temporary synchronous signal (e.g. the signal CKE_S_TEMP) into the final synchronous signal (e.g. the signal CKE_S_FINAL) based on the signal CLK. In addition, each of the synchronization circuit 51 and 52 may be implemented according to the synchronization circuit 10 shown in FIG. 1 and FIG. 2. For better comprehension, input terminals configured for receiving an asynchronous signal (such as the signal CKE_AS), a reference clock signal (such as the signal CLK) and a power on control signal (such as the signal VPU) of a single synchronization circuit (e.g. each of the synchronization circuits 51 and 52) are respectively labeled as "AS", "RCLK" and "PU" in FIG. 5, and an output terminal configured for outputting a synchronous signal (such as any of the signals CKE_O and CKE_S) is labeled as "S" in FIG. 5.

Figure 6:
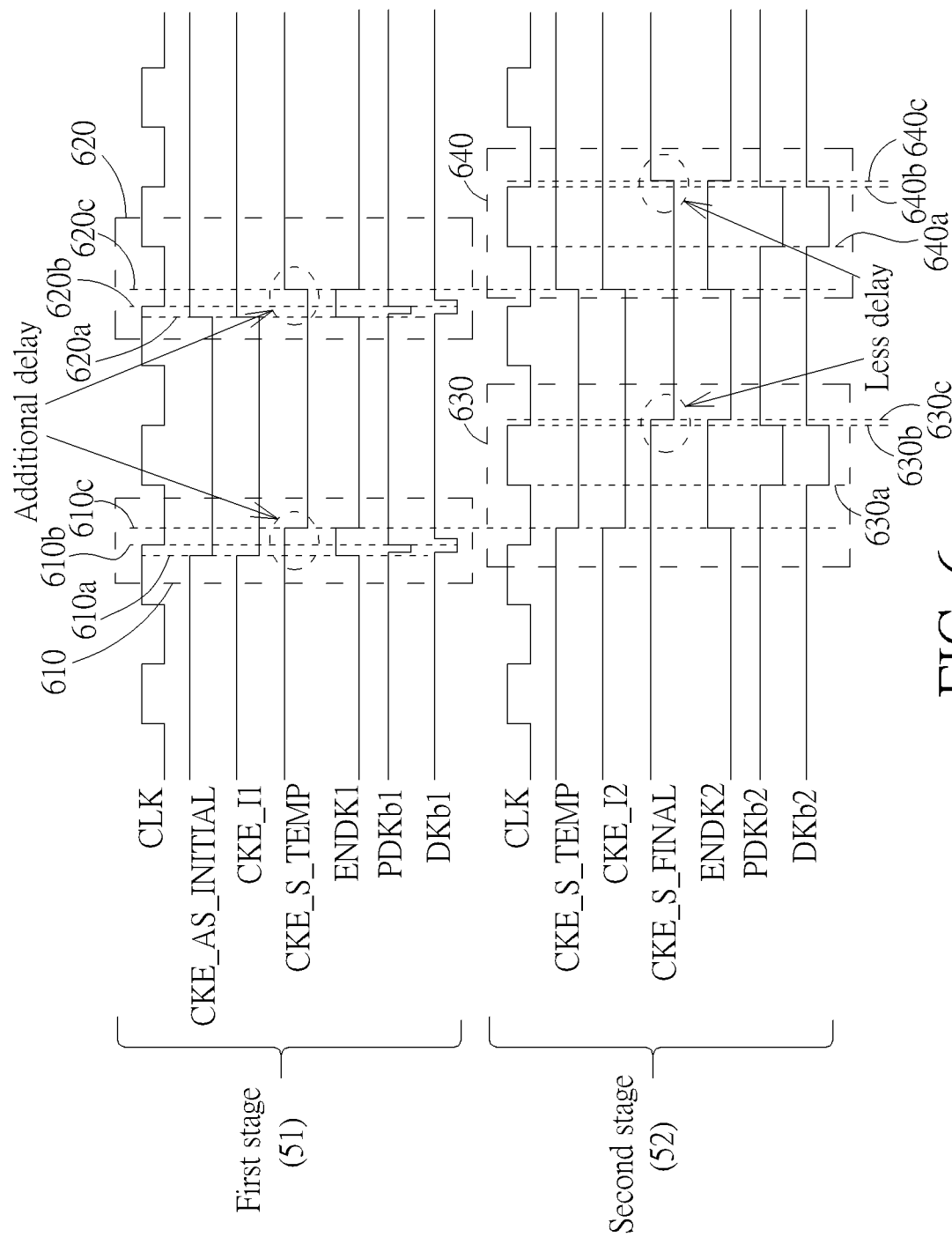
FIG. 6 is a timing diagram illustrating a plurality of signals within the cascaded synchronization circuit shown in FIG. 5 in an embodiment of the present invention.

For better comprehension, please refer to FIG. 6 in conjunction with FIG. 2 and FIG. 5, where FIG. 6 is a timing diagram illustrating a plurality of signals within the cascaded synchronization circuit 50 shown in FIG. 5 in an embodiment of the present invention. In this embodiment, the signals CLK, CKE_AS, CKE_I, CKE_S, ENDK, PDKb and DKb within the synchronization circuit 51 (first stage) may be represented by signals CLK, CKE_AS_INITIAL, CKE_I1, CKE_S_TEMP, ENDK1, PDKb1 and DKb1, and the signals CLK, CKE_AS, CKE_I, CKE_S, ENDK, PDKb and DKb within the synchronization circuit 52 (second stage) may be represented by signals CLK, CKE_S_TEMP, CKE 12, CKE_S_FINAL, ENDK2, PDKb2 and DKb2.

Regarding the first stage (the synchronization circuit 51), please refer to conditions 610 and 620. In the condition 610, after the signal CKE_AS_INITIAL turns to low at a time point 610a (note that the signal CKE_S_TEMP is high and the signal CLK is high at this moment), the signal CKE_I1 turns to low, the signal ENDK1 turns to high, and the signals PDKb1 and DKb1 turn to low. After the signal CLK turns to low at a time point 610b, the signal PDKb1 returns to high, where a high pulse (i.e. a pulse of logic value "1") of the signal PDK within the synchronization circuit 51 is wide enough to pull down the signal N2 within the synchronization circuit 51 and can be further widened in comparison with a low pulse (i.e. a pulse of logic value "0") of the signal PDKb1. More particularly, after the signal N2 within the synchronization circuit 51 turns to low in response to the signal PDK turns to high, the signal PDK within the synchronization circuit 51 may not immediately turn to low in response to the signal PDKb1 turning to high until the signal N2 within the synchronization circuit 51 is pulled up again via the signal path of the inverter 182, the NAND 185, the inverter 186, the NAND 184 and the NAND 181 within the synchronization circuit 51, thereby widening the high pulse of the signal PDK within the synchronization circuit 51 (or the low pulse of the signal DKb1). Afterwards, the signal CKE_S_TEMP turns to low and the signal ENDK1 turns to low at a time point 610c.

In the condition 620, after the signal CKE_AS_INITIAL turns to high at a time point 620a (note that the signal CKE_S_TEMP is low and the signal CLK is high at this moment), the signal CKE_I1 turns to high, the signal ENDK1 turns to high, and the signals PDKb1 and DKb1 turn to low. After the signal CLK turns to low at a time point 620b, the signal PDKb1 returns to high, where a high pulse of the signal PDK within the synchronization circuit 51 can be widened in comparison with a low pulse of the signal PDKb1, and some detailed descriptions similar to the condition 610 are not repeated here for brevity. Afterwards, the signal CKE_S_TEMP turns to high and the signal ENDK1 turns to low at a time point 620c.

Regarding the second stage (the synchronization circuit 52), please refer to conditions 630 and 640. In the condition 630, after the signal CKE_S_TEMP turns to low at the time point 610c (note that the signal CKE_S_FINAL is high and the signal CLK is low at this moment), the signal CKE 12 turns to low, and the signal ENDK2 turns to high. After the signal CLK turns to high at a time point 630a, the signal PDKb2 turns to low, and the signal DKb2 turns to low. After the signal CLK turns to low at a time point 630b, the signal DKb2 turns to high, the signal CKE_S_FINAL turn to low and the signal ENDK turns to low at a time point 630c.

In the condition 640, after the signal CKE_S_TEMP turns to high at a time point 620c (note that the signal CKE_S_FINAL is low and the signal CLK is low at this moment), the signal CKE 12 turns to high, and the signal ENDK2 turns to high. After the signal CLK turns to high at a time point 640a, the signal PDKb2 turns to low, and the signal DKb2 turns to low. After the signal CLK turns to low at a time point 640b, the signal DKb2 turns to high, the signal CKE_S_FINAL turns to high and the signal ENDK turns to low at a time point 640c.

Regarding the conditions 610 and 620 (similar to the conditions 410 and 420) shown in FIG. 6, low pulses of the signal DKb1 are widened, thereby introducing additional delay between falling edges of the signal CLK (the target timing for the synchronous signals respectively corresponding to time points 610b and 620b) and transition edges of the signal CKE_S_TEMP (respectively corresponding to time points 610c and 620c). Then, the synchronization circuit 52 may synchronize the signal CKE_S_TEMP based on the signal CLK. Note that the synchronization circuit 51 has arranged the transition edges of the signal CKE_S_TEMP to be slightly after the falling edges of the signal CLK, so the target timing for the synchronous signal (e.g. the signal CKE_S_FINAL) may be next falling edges of the signal CLK (respectively corresponding to time points 630a and 640a). Regarding the conditions 630 and 640 shown in FIG. 6, time difference between the time points 610c and 630b (or the time points 620c and 640b) are wide enough, so the aforementioned mechanism of widening low pulses of the flip-flop clock signal (e.g. the signal DKb shown in FIG. 2) will not be activated. As a result, rising edges of low pulses of the signal DKb2 may be determined by the signal CLK (or the signal CKE 12), rather than by the signal path of the inverter 182, the NAND 185, the inverter 186, the NAND 184 and the NAND 181, so delay between falling edges of the signal CLK (the target timing for the synchronous signals respectively corresponding to time points 630b and 640b) and transition edges of the signal CKE_S_FINAL (respectively corresponding to time points 630c and 640c) can be reduced and fixed in comparison with a single stage circuit (e.g. merely utilizing the synchronization circuit 51).

According to the architecture of the cascaded synchronization circuit 50 shown in FIG. 5, a phase relationship between the main clock signal (e.g. the signal CLK) and the final synchronous signal (e.g. the signal CKE_S_FINAL) is fixed regardless of the initial asynchronous signal (e.g. the signal CKE_AS_INITIAL). For example, each transition of the final synchronous signal has no extra delay relative to a corresponding falling edge of the main clock signal regardless of the initial asynchronous signal. In another example, each transition of the final synchronous signal has a fixed delay relative to the corresponding falling edge of the main clock signal regardless of the initial asynchronous signal. Thus, the cascaded synchronization circuit 50 can further improve performance in comparison with a single synchronization circuit (e.g. the synchronization circuit 10).

It should be noted that one or more signals within the synchronization circuit 10 (or the synchronization circuits 51 and 52) may be regarded as equivalent (e.g. the signals CKE_O and CKE_S), so one or more connections between some nodes that are utilized for transmitting these equivalent signals may be modified without affect overall operation of the synchronization circuit 10 (or the synchronization circuits 51 and 52), or in a way that is less likely to affect the overall operation, but the present invention is not limited thereto. In addition, implementation of providing some nodes within the synchronization circuit 10 (or the synchronization circuits 51 and 52) with initial values is not limited to that illustrated in FIG. 2. In addition, the above embodiments provide falling edge-triggered synchronization circuits (i.e. the generated synchronous signal (s) are aligned with falling edges of the reference clock signal), but the present invention is not limited thereto. Those skilled in the art should understand that a rising edge-triggered synchronization circuit can be implemented by modifying one or more logic circuits within any of the synchronization circuit 10 and 50, e.g. the flip-flop circuit 140 (or 160) or the flip-flop logic circuit 142 therein, and related detail is omitted for brevity.

To summarized, the synchronization circuit of the present invention can respectively generate sufficient hold time and setup time for signal synchronization, and a power saving mechanism is also provided. Thus, the synchronization circuit can guarantee that the synchronous signal generated by the synchronization circuit has no glitch regardless of the asynchronous signal without greatly increase overall costs. In addition, a cascaded architecture based on the synchronization circuit of the present invention is further provided in order to guarantee a phase relationship between the synchronous signal (e.g. the final synchronous signal) and target timing (e.g. the main clock CLK) is fixed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A synchronization circuit for converting an asynchronous signal into at least one synchronous signal, comprising:
    a signal control circuit, configured to latch a logic value of an internal input signal and output the internal input signal when a difference between the asynchronous signal and the synchronous signal is detected;
    a flip-flop circuit, coupled to the signal control circuit, configured to output the synchronous signal according to the internal input signal at a time point of a transition edge of a flip-flop clock signal;
    a clock enable circuit, coupled to the signal control circuit and the flip-flop circuit, configured to enable an internal clock signal when a difference between the synchronous signal and the internal input signal is detected; and
    a clock control circuit, coupled to the flip-flop circuit and the clock enable circuit, configured to output the flip-flop clock signal in response to a pulse width of the internal clock signal;
    wherein when the synchronous signal has a first logic value, the signal control circuit latches the logic value of the internal input signal and outputs the internal input signal having the logic value in response to the asynchronous signal changing from the first logic value to a second logic value, wherein the logic value of the internal input signal is equivalent to the second logic value.

2. The synchronization circuit of claim 1, wherein the signal control circuit comprises:
    an AND logic circuit, wherein a first input terminal of the AND logic circuit is configured to receive the asynchronous signal;
    a NAND logic circuit, wherein an output terminal of the NAND logic circuit is coupled to a second input terminal of the AND logic circuit, and a first input terminal of the NAND logic circuit is configured to receive the synchronous signal;
    a first NOR logic circuit, wherein a first input terminal of the first NOR logic circuit is configured to receive the synchronous signal or a derivative thereof after the synchronization circuit is powered on;
    a second NOR logic circuit, wherein an output terminal of the second NOR logic circuit is coupled to a second input terminal of the first NOR logic circuit and a second input terminal of the NAND logic circuit, a first input terminal of the second NOR logic circuit is coupled to an output terminal of the first NOR logic circuit, and a second input terminal of the second NOR logic circuit is coupled to an output terminal of the AND logic circuit; and
    an inverter, coupled to the output terminal of the second NOR logic circuit, configured to output the internal input signal.

3. The synchronization circuit of claim 1, wherein when the synchronous signal and the internal input signal have different logic values, the clock enable circuit outputs the internal clock signal according to a main clock signal; and
    when the synchronous signal and the internal input signal have a same logic value, the internal clock signal has a fix logic value.

4. The synchronization circuit of claim 3, wherein the clock enable circuit comprises:
    an exclusive-OR (XOR) logic circuit, wherein a first input terminal and a second input terminal of the XOR logic circuit are configured to receive the internal input signal and the synchronous signal, respectively; and
    a NAND logic circuit, configured to output the internal clock signal, wherein a first input terminal of the NAND logic circuit is configured to receive the main clock signal, and a second input terminal of the NAND logic circuit is coupled to an output terminal of the XOR logic circuit.

5. A synchronization circuit for converting an asynchronous signal into at least one synchronous signal, comprising:
    a signal control circuit, configured to latch a logic value of an internal input signal and output the internal input signal when a difference between the asynchronous signal and the synchronous signal is detected;
    a flip-flop circuit, coupled to the signal control circuit, configured to output the synchronous signal according to the internal input signal at a time point of a transition edge of a flip-flop clock signal;
    a clock enable circuit, coupled to the signal control circuit and the flip-flop circuit, configured to enable an internal clock signal when a difference between the synchronous signal and the internal input signal is detected; and
    a clock control circuit, coupled to the flip-flop circuit and the clock enable circuit, configured to output the flip-flop clock signal in response to a pulse width of the internal clock signal;
    wherein when the pulse width of the internal clock signal is greater than a predetermined width, the flip-flop clock signal has a pulse width greater than a minimum width, and when the pulse width of the internal clock signal is less than the predetermined width, the flip-flop clock signal has a fix logic value.

6. The synchronization circuit of claim 5, wherein the clock control circuit comprises:
    a first NAND logic circuit, wherein a first input terminal of the first NAND logic circuit is configured to receive the internal clock signal;
    an inverter, configured to output the flip-flop clock signal, wherein an input terminal of the inverter is coupled to an output terminal of the first NAND logic circuit; and
    a second NAND logic circuit, wherein a first input terminal of the second NAND logic circuit is coupled to the output terminal of the first NAND logic circuit, an output terminal of the second NAND logic circuit is coupled to a second input terminal of the first NAND logic circuit, and a second input terminal of the second NAND logic circuit is configured to receive the flip-flop clock signal or a derivative thereof after the synchronization circuit is powered on.

7. The synchronization circuit of claim 6, wherein a ratio parameter of the inverter is less than that of the second NAND logic circuit, wherein for any of the inverter and the second NAND logic circuit, the ratio parameter represents a ratio between a width-to-length ratio of an N-type transistor and that of a P-type transistor.

8. A cascaded synchronization circuit for converting an initial asynchronous signal into a final synchronous signal, comprising a first synchronization circuit and a second synchronization circuit connected in series, each synchronization circuit of the first synchronization circuit and the second synchronization circuit being configured to convert an asynchronous signal into at least one synchronous signal based on a main clock signal, wherein the first synchronization circuit converts the initial asynchronous signal into a temporary synchronous signal based on the main clock signal, the second synchronization circuit converts the temporary synchronous signal into the final synchronous signal based on the main clock signal, and said each synchronization circuit comprises:

a signal control circuit, configured to latch a logic value of an internal input signal and output the internal input signal when a difference between the asynchronous signal and the synchronous signal is detected;

a flip-flop circuit, coupled to the signal control circuit, configured to output the synchronous signal according to the internal input signal at a time point of a transition edge of a flip-flop clock signal;

a clock enable circuit, coupled to the signal control circuit and the flip-flop circuit, configured to enable an internal clock signal when a difference between the synchronous signal and the internal input signal is detected; and a clock control circuit, coupled to the flip-flop circuit and the clock enable circuit, configured to output the flip-flop clock signal in response to a pulse width of the internal clock signal;

wherein a phase relationship between the main clock signal and the final synchronous signal is fixed regardless of the initial asynchronous signal.

9. The cascaded synchronization circuit of claim 8, wherein when the synchronous signal has a first logic value, the signal control circuit latches the logic value of the internal input signal and outputs the internal input signal having the logic value in response to the asynchronous signal changing from the first logic value to a second logic value, wherein the logic value of the internal input signal is equivalent to the second logic value.

10. The cascaded synchronization circuit of claim 9, wherein the signal control circuit comprises:

an AND logic circuit, wherein a first input terminal of the AND logic circuit is configured to receive the asynchronous signal;

a NAND logic circuit, wherein an output terminal of the NAND logic circuit is coupled to a second input terminal of the AND logic circuit, and a first input terminal of the NAND logic circuit is configured to receive the synchronous signal;

a first NOR logic circuit, wherein a first input terminal of the first NOR logic circuit is configured to receive the synchronous signal or a derivative thereof after the synchronization circuit is powered on;

a second NOR logic circuit, wherein an output terminal of the second NOR logic circuit is coupled to a second input terminal of the first NOR logic circuit and a second input terminal of the NAND logic circuit, a first input terminal of the second NOR logic circuit is coupled to an output terminal of the first NOR logic circuit, and a second input terminal of the second NOR logic circuit is coupled to an output terminal of the AND logic circuit; and an inverter, coupled to the output terminal of the second NOR logic circuit, configured to output the internal input signal.

11. The cascaded synchronization circuit of claim 8, wherein when the synchronous signal and the internal input signal have different logic values, the clock enable circuit outputs the internal clock signal according to a main clock signal; and when the synchronous signal and the internal input signal have a same logic value, the internal clock signal has a fix logic value.

12. The cascaded synchronization circuit of claim 11, wherein the clock enable circuit comprises:

an exclusive-OR (XOR) logic circuit, wherein a first input terminal and a second input terminal of the XOR logic circuit are configured to receive the internal input signal and the synchronous signal, respectively; and a NAND logic circuit, configured to output the internal clock signal, wherein a first input terminal of the NAND logic circuit is configured to receive the main clock signal, and a second input terminal of the NAND logic circuit is coupled to an output terminal of the XOR logic circuit.

13. The cascaded synchronization circuit of claim 8, wherein when the pulse width of the internal clock signal is greater than a predetermined width, the flip-flop clock signal has a pulse width greater than a minimum width, and when the pulse width of the internal clock signal is less than the predetermined width, the flip-flop clock signal has a fix logic value.

14. The cascaded synchronization circuit of claim 13, wherein the clock control circuit comprises:

a first NAND logic circuit, wherein a first input terminal of the first NAND logic circuit is configured to receive the internal clock signal;

an inverter, configured to output the flip-flop clock signal, wherein an input terminal of the inverter is coupled to an output terminal of the first NAND logic circuit; and a second NAND logic circuit, wherein a first input terminal of the second NAND logic circuit is coupled to the output terminal of the first NAND logic circuit, an output terminal of the second NAND logic circuit is coupled to a second input terminal of the first NAND logic circuit, and a second input terminal of the second NAND logic circuit is configured to receive the flip-flop clock signal or a derivative thereof after the synchronization circuit is powered on.

15. The cascaded synchronization circuit of claim 14, wherein a ratio parameter of the inverter is less than that of the second NAND logic circuit, wherein for any of the inverter and the second NAND logic circuit, the ratio parameter represents a ratio between a width-to-length ratio of an N-type transistor and that of a P-type transistor.

* * * * *